United States Patent
Lam

(10) Patent No.: US 9,704,812 B1
(45) Date of Patent: Jul. 11, 2017

(54) DOUBLE-SIDED ELECTRONIC PACKAGE

(71) Applicant: ATMEL CORPORATION, San Jose, CA (US)

(72) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 15/149,033

(22) Filed: May 6, 2016

(51) Int. Cl.
| | |
|---|---|
| H01L 23/50 | (2006.01) |
| H01L 23/552 | (2006.01) |
| H01L 23/495 | (2006.01) |
| H01L 23/31 | (2006.01) |
| H01L 21/48 | (2006.01) |
| H01L 21/56 | (2006.01) |
| H01L 23/66 | (2006.01) |

(52) U.S. Cl.
CPC ........ *H01L 23/552* (2013.01); *H01L 21/4825* (2013.01); *H01L 21/4828* (2013.01); *H01L 21/565* (2013.01); *H01L 23/3114* (2013.01); *H01L 23/4952* (2013.01); *H01L 23/49513* (2013.01); *H01L 23/49537* (2013.01); *H01L 23/49541* (2013.01); *H01L 23/49575* (2013.01); *H01L 23/66* (2013.01); *H01L 2223/6677* (2013.01)

(58) Field of Classification Search
None
See application file for complete search history.

(56) References Cited

U.S. PATENT DOCUMENTS

| | | | | |
|---|---|---|---|---|
| 5,458,716 A * | 10/1995 | Alfaro | ..................... | H01L 21/50 156/245 |
| 6,313,521 B1 * | 11/2001 | Baba | ..................... | H01L 21/563 257/659 |
| 6,333,564 B1 * | 12/2001 | Katoh | ................. | H01L 23/3107 257/738 |
| 6,414,381 B1 * | 7/2002 | Takeda | .................... | H01L 23/16 257/676 |
| 6,782,610 B1 * | 8/2004 | Iijima | ................. | H01L 21/6835 205/125 |
| 7,786,747 B2 * | 8/2010 | Shih | ........................ | G02F 1/136 324/754.03 |
| 7,847,382 B2 * | 12/2010 | Pagaila | ................. | H01L 21/568 257/684 |
| 7,960,827 B1 * | 6/2011 | Miller, Jr. | ........... | H01L 23/3677 257/712 |
| 7,989,942 B2 * | 8/2011 | Toong | ................... | H01L 23/367 257/686 |

(Continued)

*Primary Examiner* — Michael Lebentritt
(74) *Attorney, Agent, or Firm* — Fish & Richardson P.C.

(57) ABSTRACT

Embodiments of a double-sided electronic package and methods for fabricating the same are disclosed. In an embodiment, an electronic package comprises: a substrate having a first surface and a second surface; a leadframe having package pad features attached to the first surface of the substrate; a first integrated circuit die attached to the leadframe and electrically coupled to at least one of the package pad features; and molding disposed on the first surface of the substrate between the package pad features, such that the package pad features extend vertically from the first surface of the substrate to a surface of the electronic package, the package pad features forming electrically conductive paths that are exposed on the surface of the electronic package.

20 Claims, 11 Drawing Sheets

(56) References Cited

U.S. PATENT DOCUMENTS

| | | | |
|---|---|---|---|
| 8,378,477 B2* | 2/2013 | Do | H01L 21/561 257/685 |
| 8,409,917 B2* | 4/2013 | Yoon | H01L 21/563 438/106 |
| 8,624,364 B2* | 1/2014 | Chow | H01L 21/563 257/667 |
| 8,765,525 B2* | 7/2014 | Yoon | H01L 23/13 257/698 |
| 9,236,319 B2* | 1/2016 | Ha | H01L 23/3128 |
| 9,287,194 B2* | 3/2016 | Hung | H01L 23/48 |
| 9,355,869 B2* | 5/2016 | Sugiyama | H01L 24/20 |
| 2005/0047106 A1 | 3/2005 | Martino | H01L 23/04 361/803 |
| 2005/0173783 A1* | 8/2005 | Chow | H01L 21/56 257/666 |
| 2006/0170092 A1* | 8/2006 | Kim | H01L 23/3128 257/690 |
| 2007/0085173 A1* | 4/2007 | Fan | H01L 21/561 257/666 |
| 2007/0200205 A1* | 8/2007 | Filoteo | H01L 23/3135 257/666 |
| 2007/0289777 A1* | 12/2007 | Pendse | H01L 23/3128 174/520 |
| 2009/0236713 A1* | 9/2009 | Xu | H01L 21/561 257/676 |
| 2009/0236726 A1* | 9/2009 | Retuta | H01L 21/561 257/690 |
| 2010/0117219 A1* | 5/2010 | Oka | H01L 23/4334 257/693 |
| 2011/0031610 A1* | 2/2011 | Yamazaki | H01L 23/4985 257/693 |
| 2011/0151623 A1* | 6/2011 | Takahashi | H01L 21/56 438/110 |
| 2012/0188738 A1* | 7/2012 | Warren | H05K 3/284 361/807 |
| 2012/0313252 A1* | 12/2012 | Ueda | H01L 23/3121 257/773 |
| 2014/0097527 A1* | 4/2014 | Abbott | H01L 23/49541 257/676 |
| 2014/0217566 A1* | 8/2014 | Goida | H01L 23/04 257/676 |
| 2014/0346656 A1* | 11/2014 | Eugene Lee | H01L 23/49503 257/676 |
| 2016/0172323 A1* | 6/2016 | Tomita | H01L 24/17 257/774 |

* cited by examiner

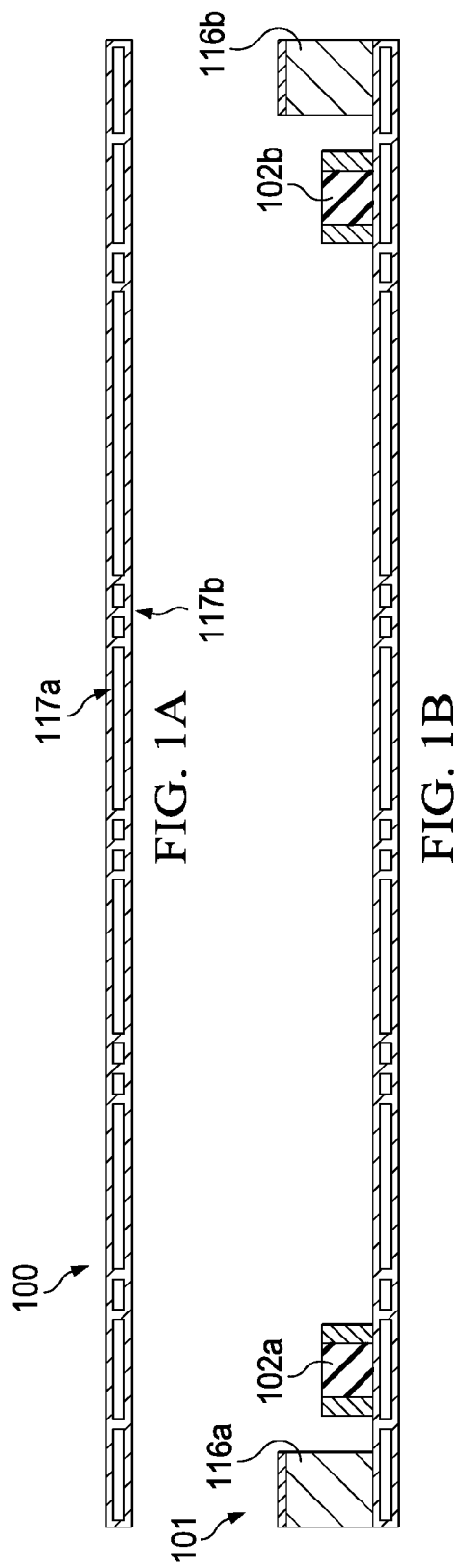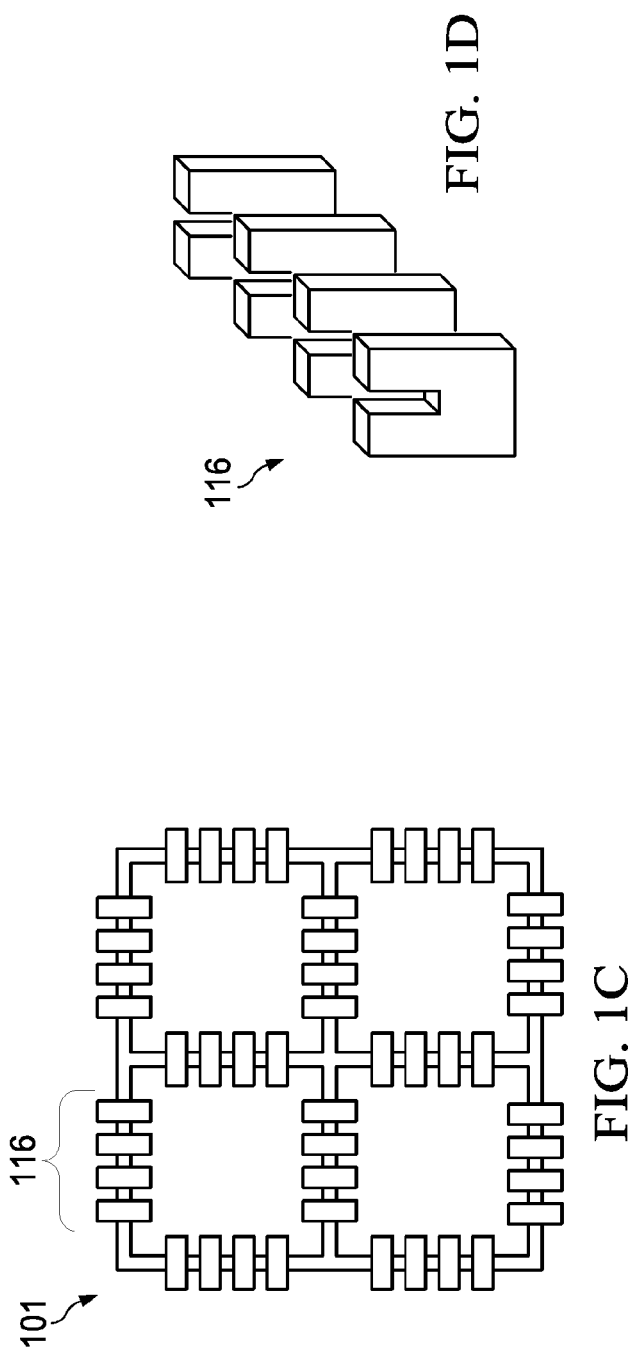

DOUBLE-SIDED ELECTRONIC PACKAGE

TECHNICAL FIELD

The subject matter of this disclosure relates generally to electronic packaging.

BACKGROUND

Complex system products often integrate different functions. One company may not make all the integrated circuit (IC) devices for implementing the different functions. Obtaining IC die from other companies, especially from competitors, is difficult. Although buying a finished electronic package may be possible in the market today, such finished electronic packages may not allow customers to add-on their unique device functions to create a final product.

SUMMARY

Embodiments of a double-sided electronic package and methods for fabricating the same are disclosed. In an embodiment, an electronic package comprises: a substrate having a first surface and a second surface; a leadframe having package pad features attached to the first surface of the substrate; a first integrated circuit die attached to the leadframe and electrically coupled to at least one of the package pad features; and molding disposed on the first surface of the substrate between the package pad features, such that the package pad features extend vertically from the first surface of the substrate to a surface of the electronic package, the package pad features forming electrically conductive paths that are exposed on the surface of the electronic package.

In another embodiment, a method comprises: attaching a leadframe to a first surface of a substrate, the leadframe having package pad features; attaching a first integrated circuit die to the leadframe and electrically coupling the first integrated circuit die to at least one of the package pad features; and disposing molding on the first surface of the substrate between the package pad features, such that the package pad features extend vertically from the first surface of the substrate to a surface of the electronic package, the package pad features forming electrically conductive paths to the surface of the electronic package.

In another embodiment, a package-on-package (PoP) assembly comprises: a first package; and a second package coupled to the first package, the second package including: a substrate having a first surface and a second surface; a leadframe having package pad features attached to the first surface of the substrate; a first integrated circuit die attached to the leadframe and electrically coupled to at least one of the package pad features; and molding disposed on the first surface of the substrate between the package pad features, such that the package pad features extend from the first surface of the substrate to a surface of the electronic package, the package pad features forming electrically conductive paths that are exposed on the surface of the electronic package.

BRIEF DESCRIPTION OF THE DRAWINGS

FIG. 1A is a side view of a double-sided (or multi-layer) laminate substrate, according to an embodiment FIG. 1B is a side view of a leadframe attached to the substrate shown in FIG. 1A, according to embodiment.

FIG. 1C is top plan view of the leadframe shown in FIG. 1B, according to an embodiment.

FIG. 1D is a perspective view of pad features of the leadframe shown in FIG. 1B, according to an embodiment.

DETAILED DESCRIPTION

Package-on-package (PoP) is an IC packaging method to combine vertically discrete logic and memory ball grid array (BGA) packages. Two or more packages are stacked on top of each other with an interface to route signals between the packages. This allows higher component density in devices, such as mobile phones. POP solutions in the market today do not have flexibility of post-assembly add-on features to allow customization of a final product, especially by a third party customer. The disclosure that follows describes a flexible post-assembly add-on electronic package design/ footprint that can be attached to a top surface of a fully tested/characterized package module.

Example Double-Sided Electronic Package

Figure 1E:
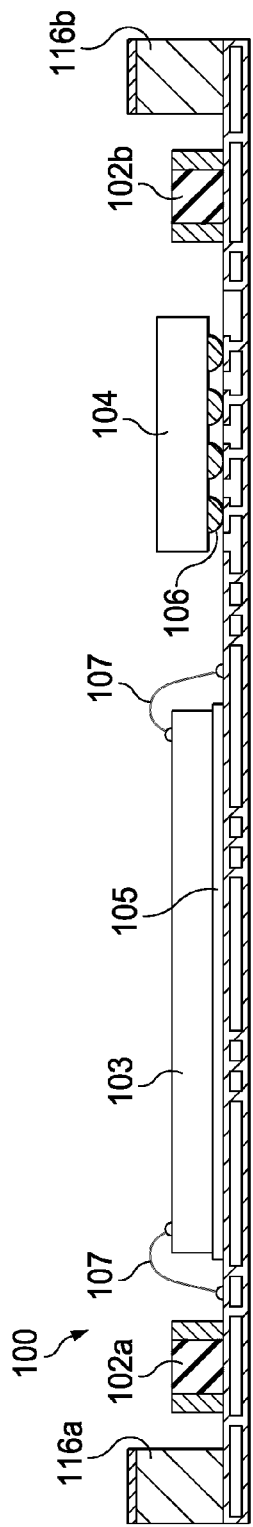
FIG. 1E is a side view of the substrate with attached leadframe and integrated circuit dies, according to an embodiment.
Figure 1F:
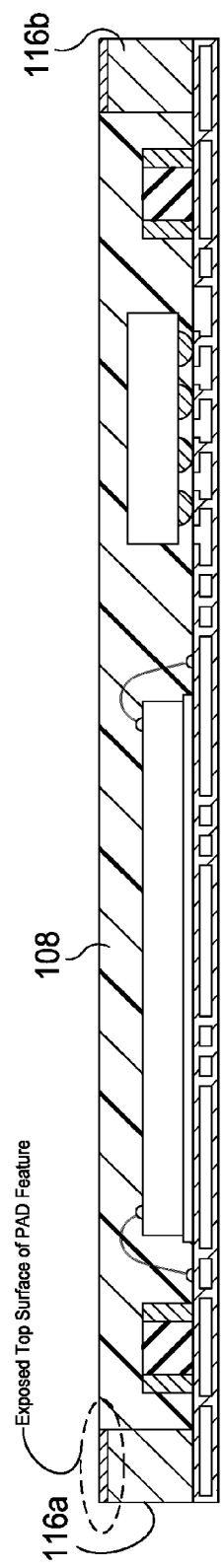
FIG. 1F is a side view of the structure shown in FIG. 1E including molding, according to an embodiment.

FIG. 1A is a side view of double-sided (or multi-layer) laminate substrate 100 having a first surface 117a and a second surface 117b. FIG. 1B shows leadframe 101 having package pad features 116a, 116b and discrete components 102a, 102b attached to first surface 117a of substrate 100. FIG. 1C is a top plan view of leadframe 101 showing package pad features 116. FIG. 1D is a perspective view of package pad features 116 of leadframe 101. FIG. 1E shows integrated circuit (IC) die 103 attached to substrate 100 with die-attachment material 105 and wirebonds 107 electrically connecting IC die 103 to leadframe 101. IC die 104 is a flip-chip electrically connected to leadframe 101 with solder bumps 106. FIG. 1F shows application of film-assist molding 108 to cover IC dice 103, 104 and discrete components 102a, 102b. Note that the top surfaces of package pad features 116a, 116b are exposed through the molding.

Figure 1G:
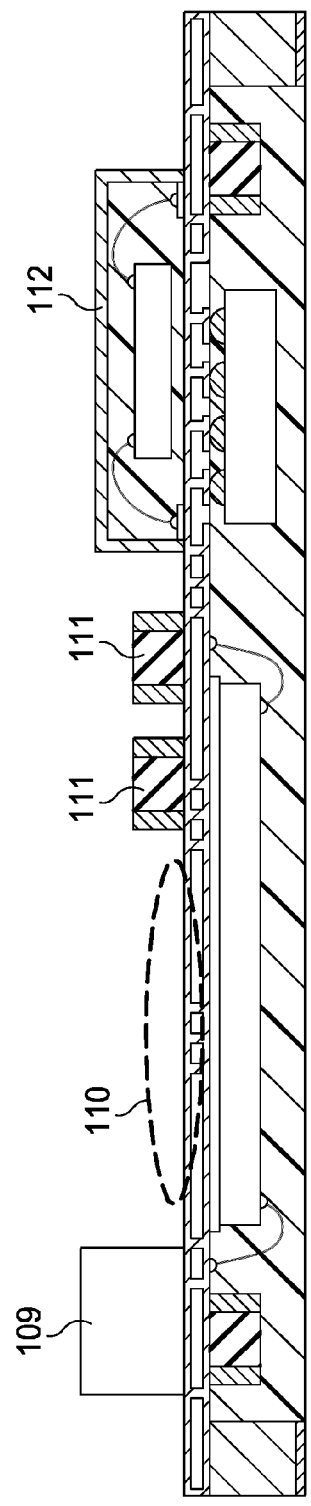
FIG. 1G is a side view of the structure of FIG. 1F flipped to expose top surfaces of pad features for surface-mount-technology (SMT) assembly, according to an embodiment.
Figure 1H:
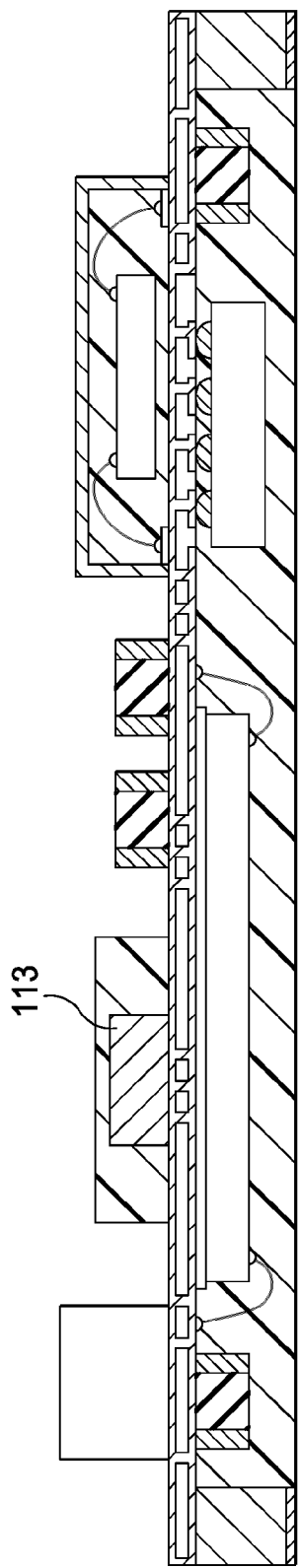
FIG. 1H is a side view of the structure of FIG. 1G showing the addition of a device at a vacant attachment site to produce a final package, according to an embodiment.

FIG. 1G is a side view of a molded package 100 flipped over with the bottom side (substrate surface 117b) of the package at the top. The bottom side can be used as a printed circuit board (PCB) for electronic components and includes conductive traces. In the example shown, oscillator 109 was added to the bottom side. Also added are chip caps 111 and a shielded radio frequency (RF) device 112. To facilitate add-on elements, one or more vacant attachment sites 110 can be included on the bottom side of molded package 100. FIG. H shows the addition of device 113 (e.g., a sensor) at the vacant attachment site 110 to produce a final package. Vacant attachment site 110 allows a customer or other third party to add-on one or more devices to make a total system.

Figure 2:
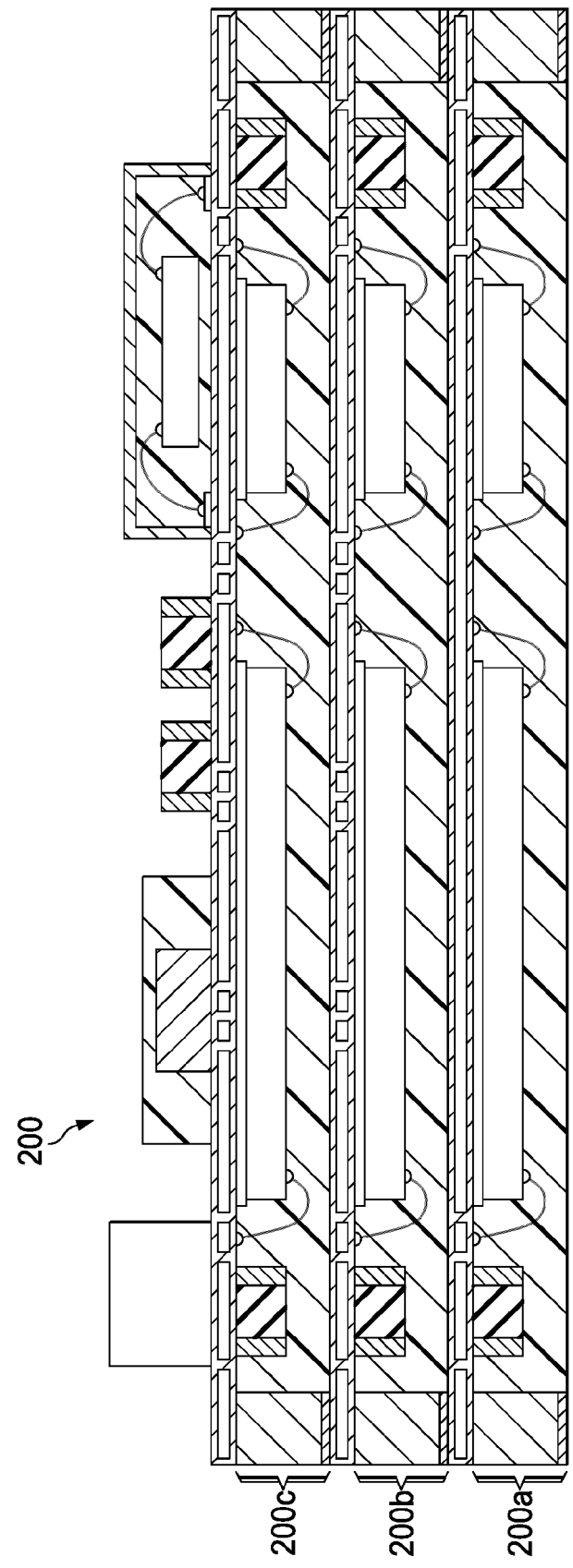
FIG. 2 is a side view of a package-on-package (PoP) assembly, according to an embodiment.

FIG. 2 is a side view of PoP assembly 200 including three molded packages to increase product functions. Each package 201a-201c can be individually tested/characterized before final assembly into PoP assembly 200 for high assembly yield. In an embodiment, packages 201a-201c are soldered together allowing for re-work or replacement of a package to change a product function. The package connection techniques can also include mechanical or conductive adhesive.

Figure 3:
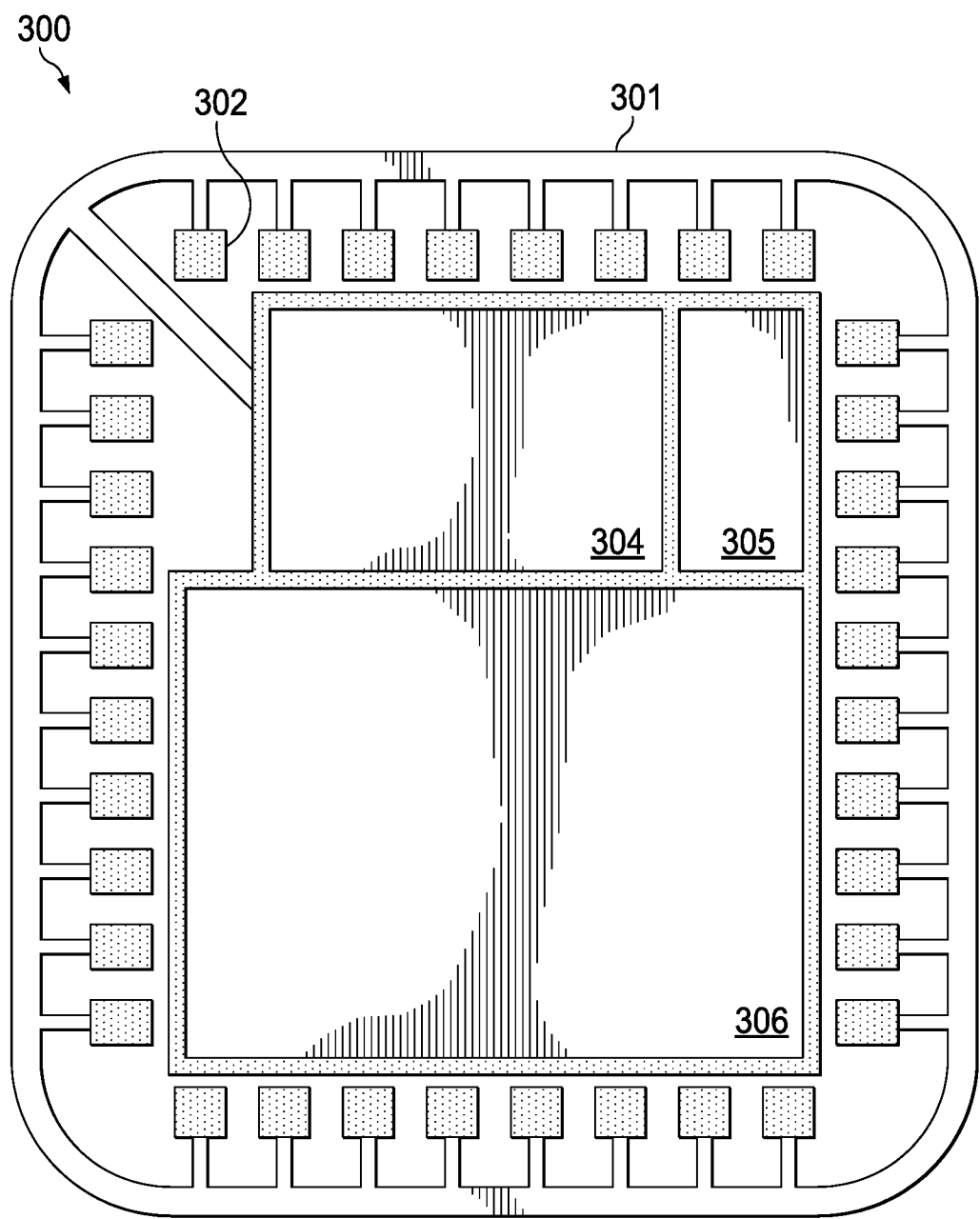
FIG. 3 is a top plan view of an example leadframe with integrated RF shielding, according to an embodiment.

FIG. 3 is a top plan view of an example leadframe 300 with integrated RF shielding, according to an embodiment. Leadframe 300 includes etched portions 301 (e.g., half etched) and full leadframe thickness portions 302. The full thickness portions 302 include the package pads and sides of attachment sites 304-306. Attachment sites 304-306 are also etched (e.g. half etched) to provide RF shielding for IC dies.

Figure 4A:
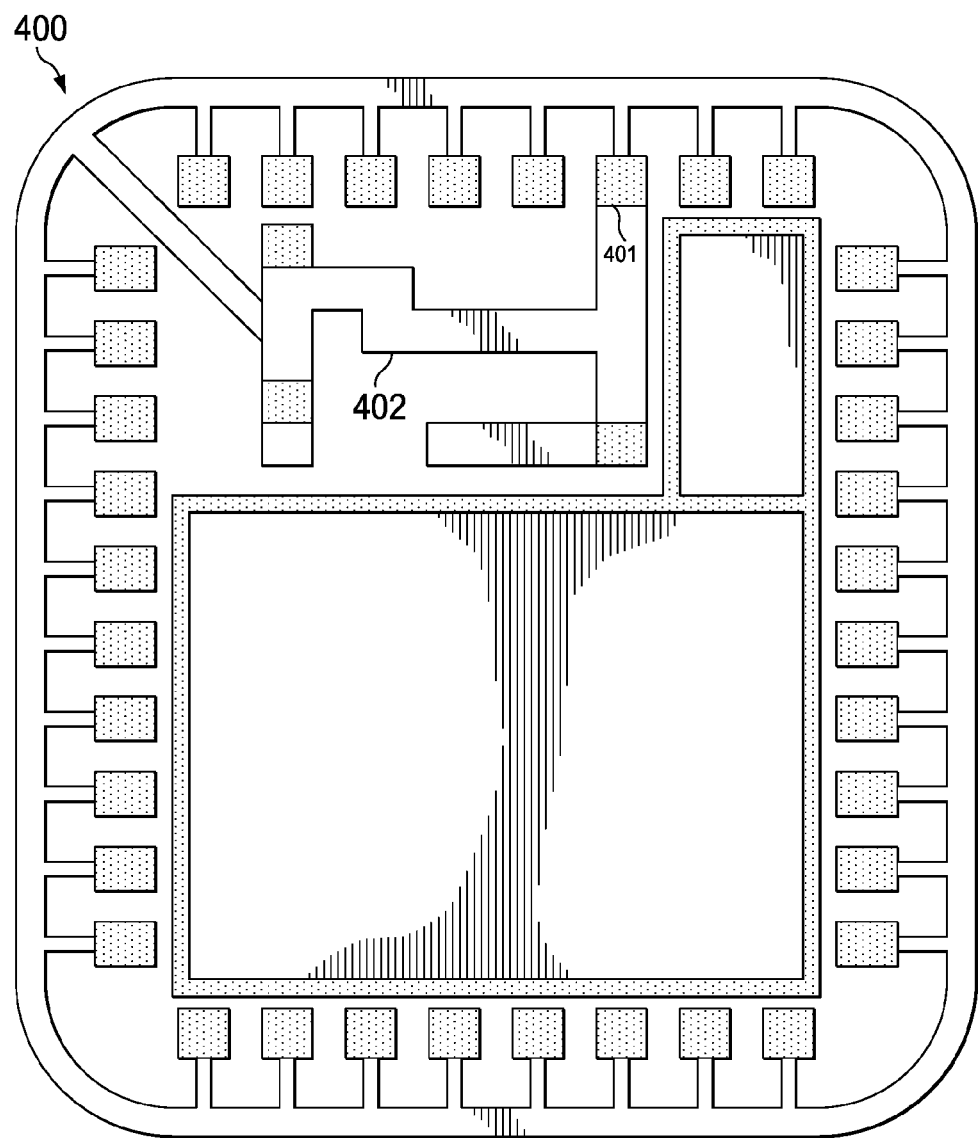
FIG. 4A is a top plan view of another example leadframe with integrated RF shielding, according to an embodiment.
Figure 4B:
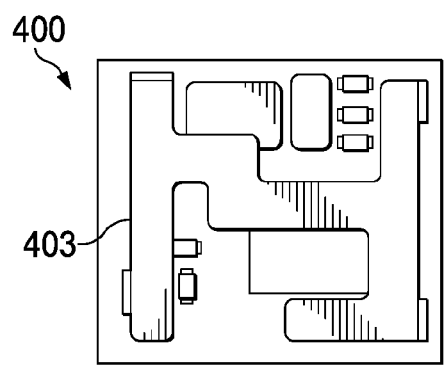
FIG. 4B is a top plan view of the leadframe 4A with a stamped antenna and RF IC die, according to an embodiment.

FIG. 4A is a top plan view of another example leadframe 400 with integrated RF shielding, according to an embodiment. Leadframe 400 is similar to leadframe 300 except that attachment site 304 is replaced with antenna site 402. Antenna site 402 is etched (e.g., half etched) to shield a stamped antenna against RF interference. Antenna site 402 is electrically coupled to package pad 401. FIG. 4B is a top plan view of the leadframe 400 with stamp antenna 403 at antenna site 402.

Figure 5A:
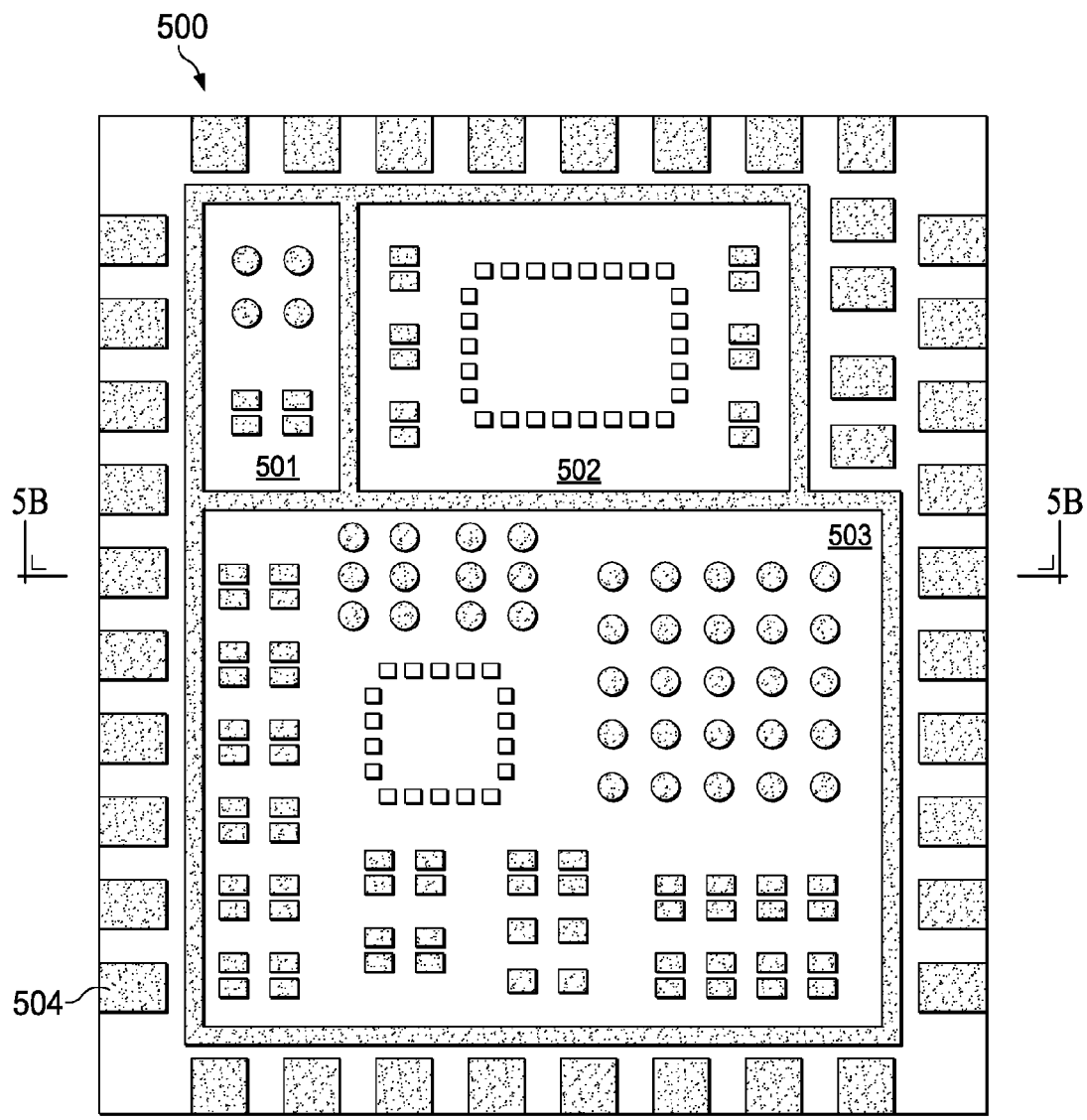
FIG. 5A is a top plan view of an example double-sided or multilayer laminate substrate, according to an embodiment.
Figure 5B:
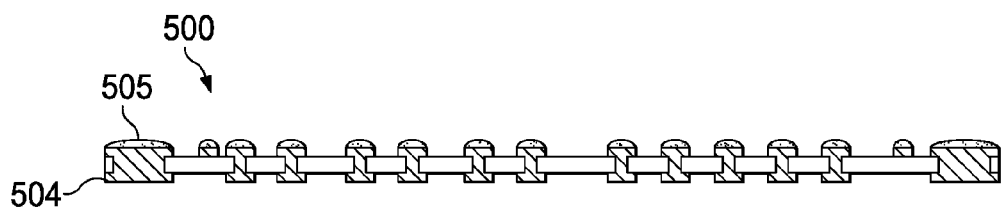
FIG. 5B is a side view of an example double-sided or multilayer laminate substrate illustrating solder paste printing deposition for SMT components, according to an embodiment.

FIGS. 5A and 5B are top plan and side views, respectively, of an example double-sided or multilayer laminate substrate 500. Substrate 500 includes attachment sites 501-503 with stencil patterns for SMT components and package pads 504. FIG. 5B illustrates solder paste printing deposition for SMT components where solder paste 505 is deposited on pads 504. In an embodiment, solder paste 505 is deposited and then melted in a heated oven to form a solder join. This method of forming solder joins improves the time of production, improves production capacity in terms of quantity of completed product, increases the density of components that can be mounted on the PCB fabrications and helps produce products with smaller size.

Figure 6A:
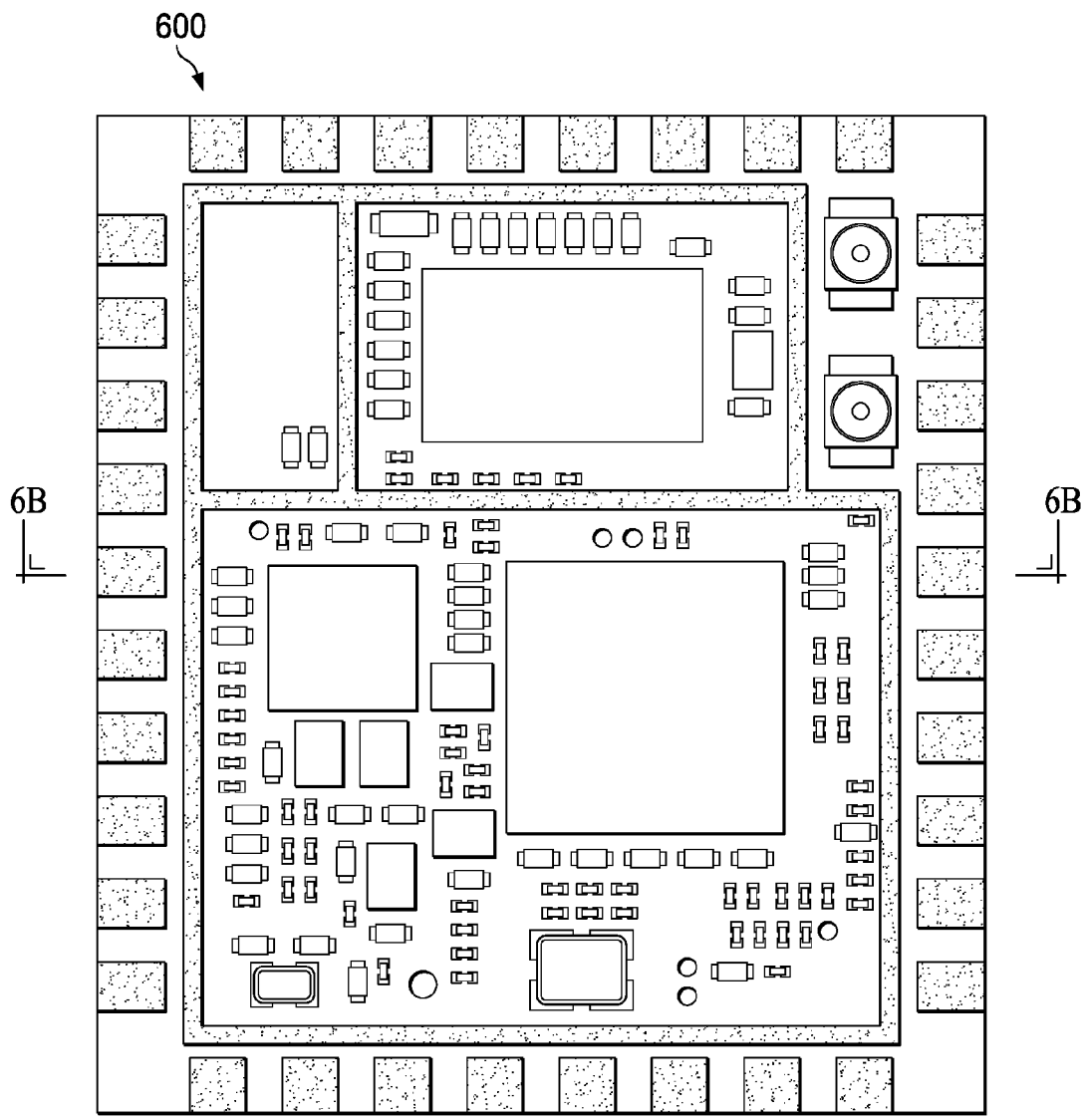
FIG. 6A is a top plan view of an example SMT assembly including die-attach wirebond components, according to an embodiment.
Figure 6B:
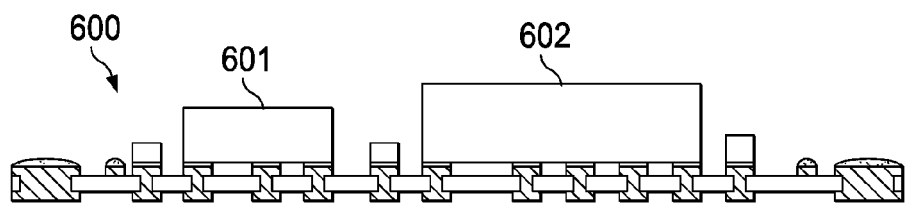
FIG. 6B is a side view of an example SMT assembly including die-attach wirebond components, according to an embodiment.
Figure 6C:
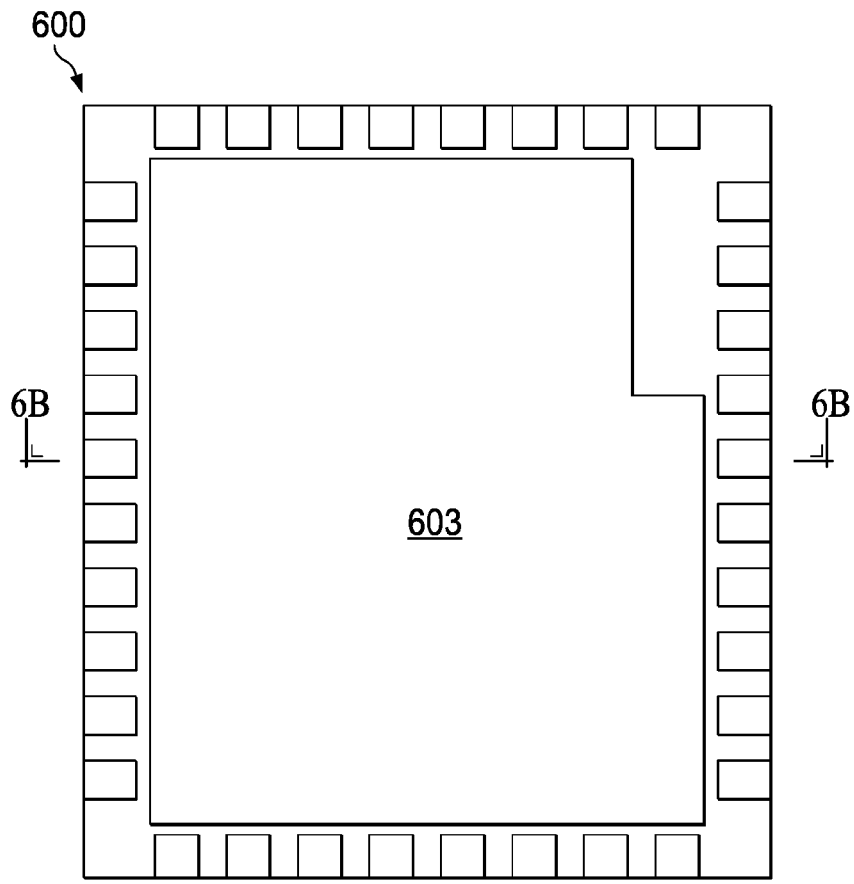
FIG. 6C is a top plan view of an example SMT assembly leadframe solder-reflow, according to an embodiment.
Figure 6D:
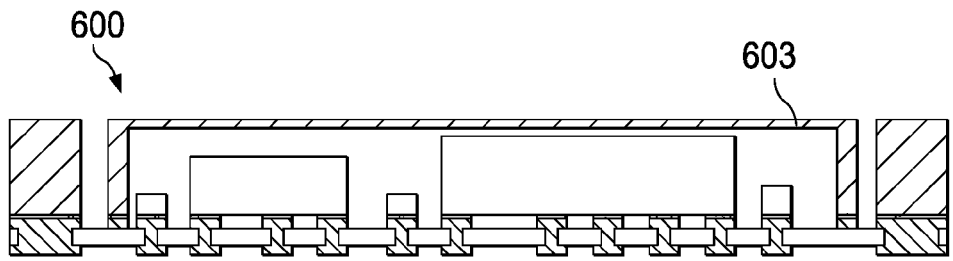
FIG. 6D is a side view of an example SMT assembly leadframe solder-reflow, according to an embodiment.
Figure 6E:
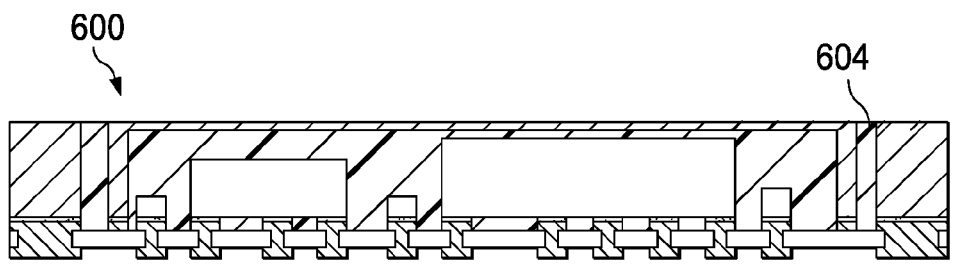
FIG. 6E is a side view of an example SMT assembly with film-assist overmold, according to an embodiment.
Figure 6F:
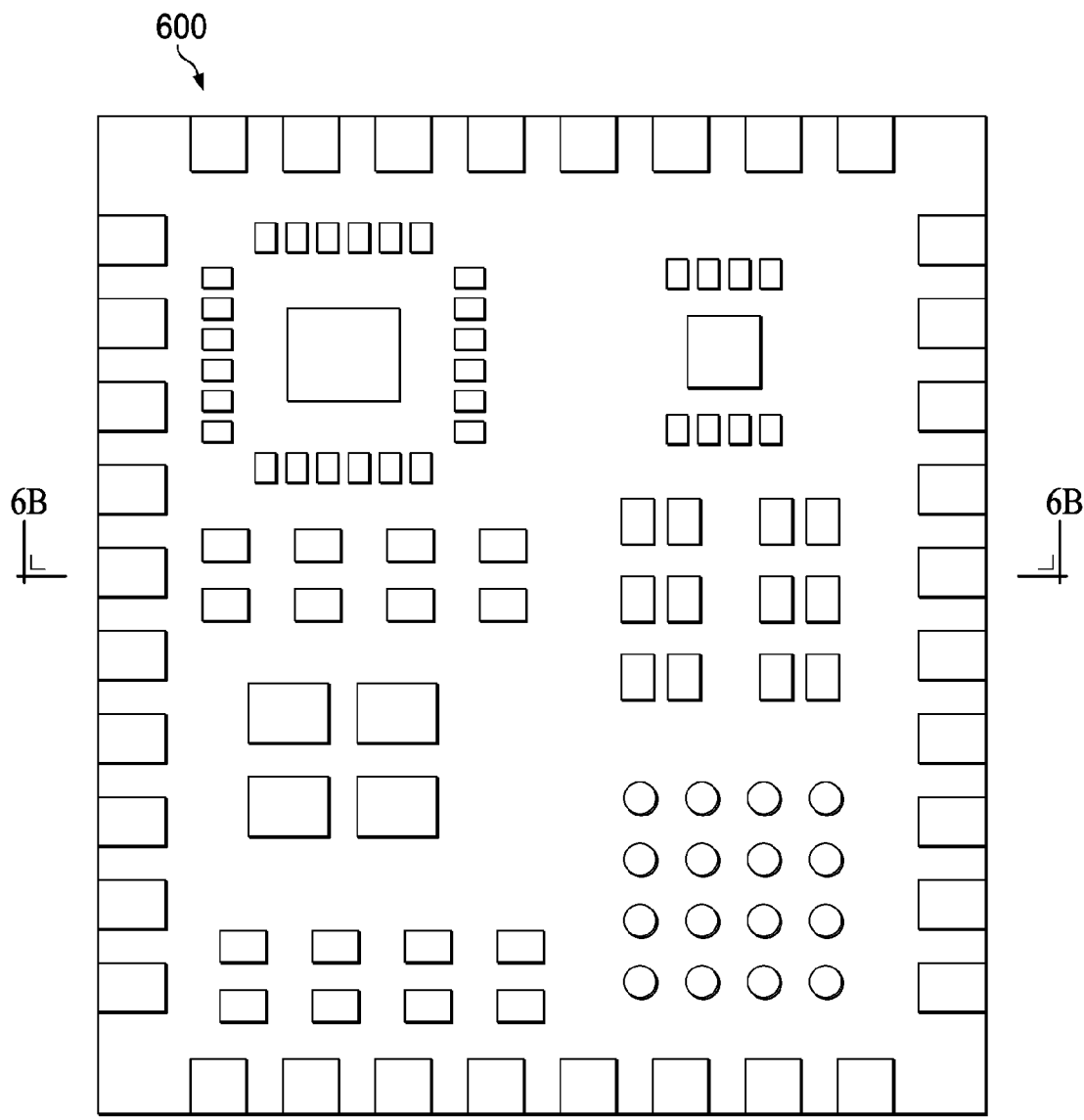
FIG. 6F is a top plan view of an example molded SMT assembly, according to an embodiment.
Figure 6G:
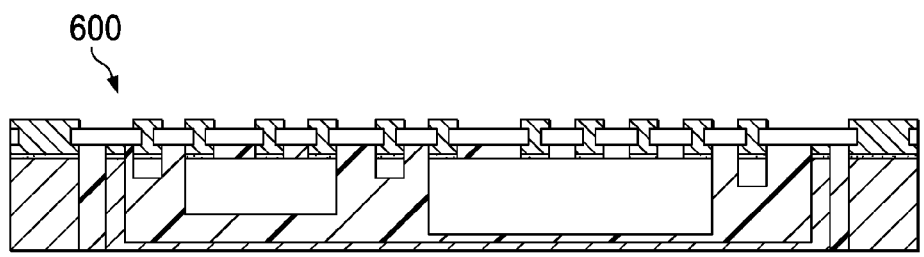
FIG. 6G is a side view of an example molded SMT assembly, according to an embodiment.

FIGS. 6A and 6B are top plan and side views, respectively, of an example SMT assembly 600, including die-attach wirebond components 601, 602, according to an embodiment. FIGS. 6C and 6D are top plan and side views, respectively, of an SMT assembly 600 leadframe solder-reflow 603 attached onto laminate substrate 600. FIG. 6E is a side view of an example SMT assembly 600 with film-assist overmold 604, according to an embodiment. FIGS. 6F and 6G are top plan and side views, respectively, of the molded SMT assembly 600 flipped over so that the bottom side (surface 117b) of the substrate becomes the top side PCB ready for components assembly.

Figure 7:
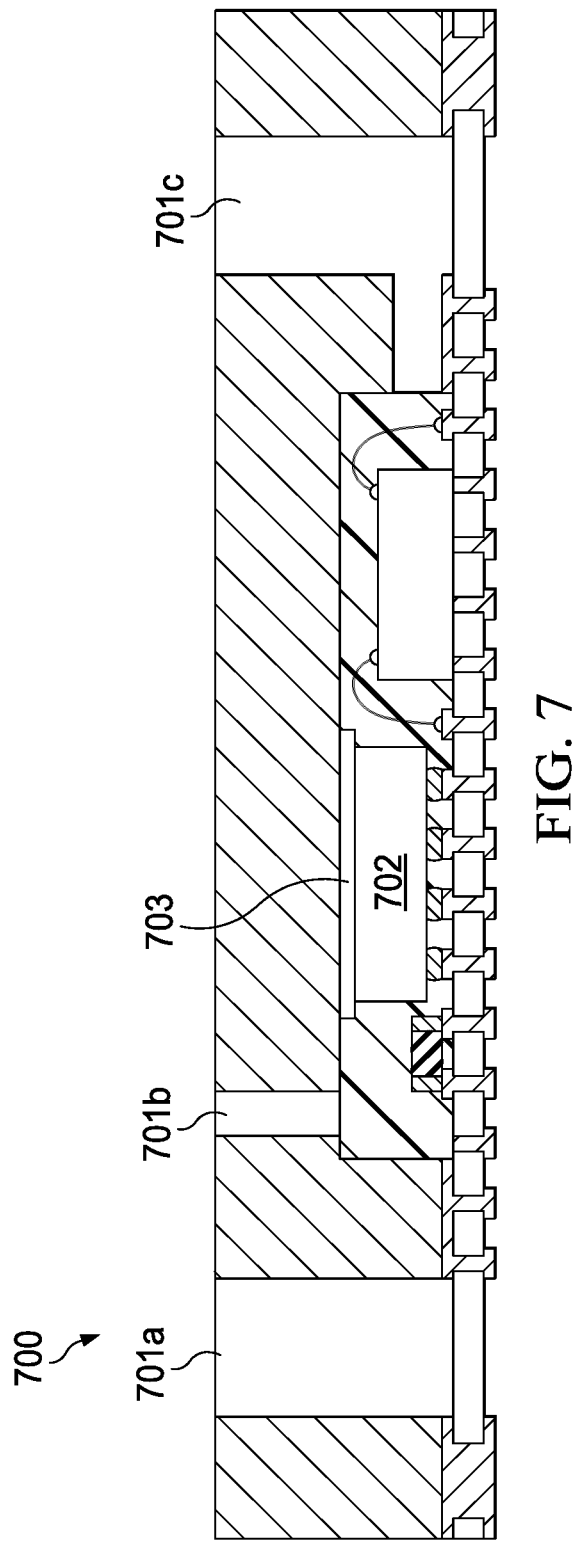
FIG. 7 is a side view of a package assembly configured for effective heat dissipation, according to an embodiment.

FIG. 7 is a side view of a package assembly 700 configured for effective heat dissipation, according to an embodiment. The backside of high power device 702 can be directly attached (e.g., with conductive epoxy) onto metal shield 703 for effective heat dissipation. Vents 701a-701c can be included in the mold 703 for mold-flow.

Package pad features 116, when electrically connected to substrate 100 create an electrically conductive path from substrate 100 to the top surfaces of package features 116 (FIG. 1F), which after molding 108 are exposed through the molding to allow electrical connection to another package in a PoP assembly. This creates a package with both top and bottom side contacts. The molded side of the package with the exposed top surfaces of package pad features 116 is "flipped" and used for SMT assembly. The opposite package side becomes the "top" side of the package for electronic components to be attached. Package pad features 116 also help create a double-sided package that allows components to be integrated into leadframe 101, such as an RF shield or antenna resulting in a lower fabrication cost.

Example Process

Figure 8:
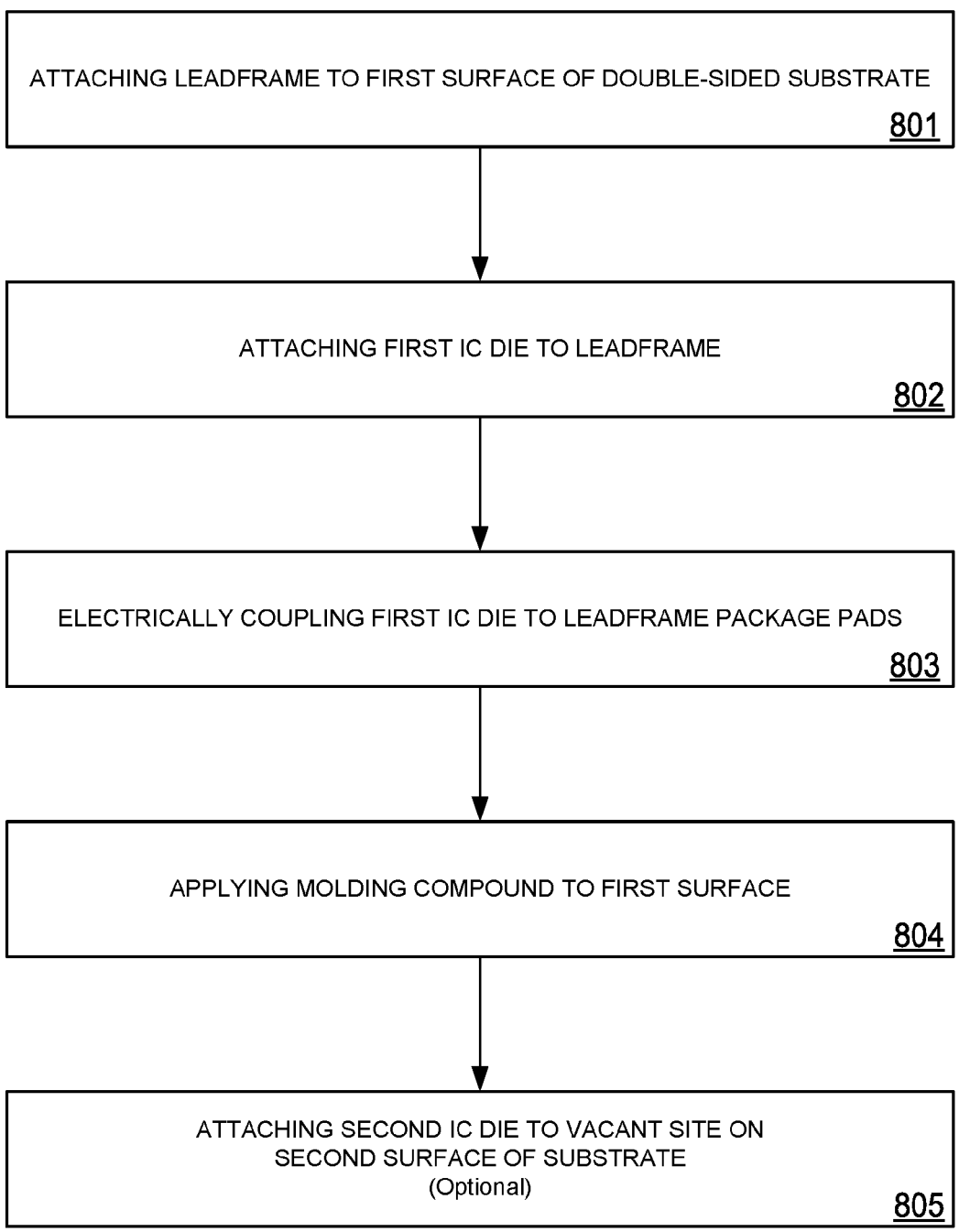
FIG. 8 is a flow diagram of an example process of fabricating a double-sided electronic package, according to an embodiment.

FIG. 8 is a flow diagram of an example process 800 of fabricating a double-sided electronic package, according to an embodiment.

In an embodiment, process 800 begins by attaching a package pad frame to a first side of a double sided laminate substrate (801). Process 800 continues by attaching one more components to the package pad leadframe and electrically connecting the components to the package pads (802). Process 800 continues by applying film-assist molding to the first side of the double sided laminate substrate such that the components are covered by molding material (803). Process 800 continues by configuring a second side of the double sided laminate substrate to be a PCB with one or more vacant sites for adding on components (804). Adding one or more additional components at the one or more vacant sites (805). Process 800 continues by optionally testing the completed electronic package (806). Process 800 continues by optionally adding the completed electronic package to a PoP assembly (807).

While this document contains many specific implementation details, these should not be construed as limitations on the scope of what may be claimed but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. An electronic package comprising:
   a substrate having a first surface and a second surface;
   a leadframe having package pad features attached to the first surface of the substrate;
   a first integrated circuit die attached to the leadframe and electrically coupled to at least one of the package pad features; and
   molding disposed on the first surface of the substrate between the package pad features, such that the package pad features extend vertically from the first surface of the substrate to a surface of the electronic package, the package pad features forming electrically conductive paths that are exposed on the surface of the electronic package.

2. The electronic package of claim 1, comprising:
   a second integrated circuit die attached to the second surface at an attachment site.

3. The electronic package of claim 1, wherein the first integrated circuit die is attached to an etched portion of the leadframe that provides radio frequency shielding for the first integrated circuit die.

4. The electronic package of claim 1, wherein a stamped antenna is disposed on an etched portion of the leadframe.

5. The electronic package of claim 1, wherein the first integrated circuit die is a surface-mount-technology (SMT) component.

6. The electronic package of claim 1, wherein the electronic package includes vents for mold flow.

7. The electronic package of claim 1, wherein the first integrated circuit die flip-chip is mounted to the leadframe with solder bumps.

8. A method comprising:
   attaching a leadframe to a first surface of a substrate, the leadframe having package pad features;
   attaching a first integrated circuit die to the leadframe and electrically coupling the first integrated circuit die to at least one of the package pad features; and
   disposing molding on the first surface of the substrate between the package pad features, such that the package pad features extend vertically from the first surface of the substrate to a surface of the electronic package, the package pad features forming electrically conductive paths to the surface of the electronic package.

9. The method of claim 8, further comprising:
   attaching a second integrated circuit die to the second surface.

10. The method of claim 8, wherein attaching the first integrated circuit die further comprises:
    etching a portion of the leadframe; and
    attaching the first integrated circuit die to the etched portion.

11. The method of claim 8, further comprising:
    etching a portion of the leadframe; and
    forming a stamped antenna on the etched portion of the leadframe.

12. The method of claim 8, further comprising:
    forming vents in the electronic package for mold flow.

13. The method of claim 8, further comprising:
    soldering the first integrated circuit die to the first surface with solder bumps.

14. A package-on-package (PoP) assembly comprising:
    a first package; and
    a second package coupled to the first package, the second package including:
       a substrate having a first surface and a second surface;
       a leadframe having package pad features attached to the first surface of the substrate;
       a first integrated circuit die attached to the leadframe and electrically coupled to at least one of the package pad features; and
       molding disposed on the first surface of the substrate between the package pad features, such that the package pad features extend from the first surface of the substrate to a surface of the electronic package, the package pad features forming electrically conductive paths that are exposed on the surface of the electronic package.

15. The PoP assembly of claim 14, comprising:
    a second integrated circuit die attached to the second surface at an attachment site.

16. The PoP assembly of claim 14, wherein the first integrated circuit die is attached to an etched portion of the leadframe that provides radio frequency shielding for the first integrated circuit die.

17. The PoP assembly of claim 14, wherein a stamped antenna is disposed on an etched portion of the leadframe.

18. The PoP assembly of claim 14, wherein the first integrated circuit die is a surface-mount-technology (SMT) component.

19. The PoP assembly of claim 14, wherein the first package is electrically coupled to the second package by the package pad features.

20. The PoP assembly of claim 14, wherein the first package is soldered to the second package.

* * * * *